United States Patent
Takizawa et al.

(10) Patent No.: US 8,035,708 B2
(45) Date of Patent: Oct. 11, 2011

(54) SOLID-STATE IMAGING DEVICE WITH AN ORGANIC PHOTOELECTRIC CONVERSION FILM AND IMAGING APPARATUS

(75) Inventors: Ritsuo Takizawa, Tokyo (JP); Taichi Natori, Kanagawa (JP)

(73) Assignee: Sony Corporation, Tokyo (JP)

( * ) Notice: Subject to any disclaimer, the term of this patent is extended or adjusted under 35 U.S.C. 154(b) by 528 days.

(21) Appl. No.: 12/061,135

(22) Filed: Apr. 2, 2008

(65) Prior Publication Data

US 2008/0246853 A1   Oct. 9, 2008

(30) Foreign Application Priority Data

Apr. 6, 2007 (JP) ................................ 2007-100266

(51) Int. Cl.
- H04N 3/14 (2006.01)
- H04N 9/04 (2006.01)
- H01L 27/00 (2006.01)
- H01L 31/062 (2006.01)

(52) U.S. Cl. ........ 348/272; 348/273; 348/269; 348/294; 250/208.1; 257/291; 257/292

(58) Field of Classification Search .......... 348/268–269, 348/272–273; 257/233
See application file for complete search history.

(56) References Cited

U.S. PATENT DOCUMENTS

| | | | |
|---|---|---|---|
| 6,690,422 B1 * | 2/2004 | Daly et al. | 348/273 |
| 2003/0128409 A1 * | 7/2003 | Vook et al. | 358/513 |
| 2007/0012955 A1 * | 1/2007 | Ihama | 257/233 |

FOREIGN PATENT DOCUMENTS

| | | |
|---|---|---|
| JP | 2003-234460 | 8/2003 |
| JP | 2003-332551 | 11/2003 |
| JP | 2004-273952 | 9/2004 |
| JP | 2004-281773 | 10/2004 |
| JP | 2005-303266 | 10/2005 |
| JP | 2007-059515 | 3/2007 |
| JP | 2007-311550 | 11/2007 |

OTHER PUBLICATIONS

Japanese Patent Office Action corresponding to Japanese Serial No. 2007-100266 dated Feb. 23, 2010.

Japanese Office Action issued on Feb. 24, 2009 corresponding to JP Application No. 2007-100266.

* cited by examiner

*Primary Examiner* — Lin Ye
*Assistant Examiner* — Mekonnen Dagnew
(74) *Attorney, Agent, or Firm* — SNR Denton US LLP

(57) ABSTRACT

There is provided a solid-state imaging device including a plurality of pixels that are provided on a semiconductor substrate, and that include a plurality of photoelectric-conversion units and metal oxide semiconductor transistors that selectively read signals from the plurality of photoelectric-conversion units, an organic-photoelectric-conversion film disposed on the plurality of photoelectric-conversion units, and an organic-color-filter layer disposed on the plurality of photoelectric-conversion units. Only a signal corresponding to a first color is extracted through the organic-photoelectric-conversion film. Signals corresponding to a plurality of colors not including the first color are extracted by absorption spectroscopy using the organic-color-filter layer.

4 Claims, 7 Drawing Sheets

SOLID-STATE IMAGING DEVICE WITH AN ORGANIC PHOTOELECTRIC CONVERSION FILM AND IMAGING APPARATUS

CROSS REFERENCES TO RELATED APPLICATIONS

The present invention contains subject matter related to Japanese Patent Application JP 2007-100266 filed in the Japanese Patent Office on Apr. 6, 2007, the entire contents of which are incorporated herein by reference.

BACKGROUND OF THE INVENTION

1. Field of the Invention

The present invention relates to solid-state imaging devices and imaging apparatuses.

2. Description of the Related Art

Semiconductor image sensors, which are solid-state imaging devices, include complementary metal-oxide semiconductor (CMOS) sensors and charge-coupled devices (CCDs). The CMOS sensors include a plurality of pixels, which have photoelectric-conversion units that convert incident light to electric signals, and metal-oxide semiconductor (MOS) transistors that selectively read the electric signals from each of the pixels. The CCDs include a plurality of pixels, which have photoelectric-conversion units that convert incident light to electric signals, and transfer signal charges, which are read from each of the pixels, through a silicon substrate. Both the CMOS sensors and the CCDs are semiconductor devices in which signals are read from pixels. Recently, the CMOS sensors have drawn attention as imaging devices used in cameras for mobile phones, digital still cameras, and digital video cameras because of the positive characteristics, such as low voltage, low power consumption, and multifunctionality. The range in which the CMOS sensors are used has been expanded.

More specifically, for a color image sensor, the technology has been used in which a color filter including three colors, such as red, green, blue, is formed in each pixel (red-green-blue Bayer pattern is common) and in which color separation is spatially performed. In this technology, an excellent color reproduction can be achieved by appropriately adjusting spectral characteristics of the color filter. However, the technology has a substantial problem that it is difficult to sufficiently effectively use light that enters the color image sensor because the color filter itself considerably absorbs light. Additionally, the technology has the following problems: Since the color separation is spatially performed, it is difficult to effectively use the pixels of the color image sensor; when the number of green pixels is small, the resolution of luminance signals is decreased; and when the number of red or blue pixels is small, the resolution of color signals is decreased, or false color signals occur.

Furthermore, with the increasing miniaturization of image sensors and the increasing number of pixels in the image sensors, recently, the cell size of one pixel has been reduced to 2.0 µm square or less. In accordance with this size reduction, obviously, an area per pixel and a volume per pixel are reduced. As a result, the saturation level and the sensitivity are reduced, thereby reducing the image quality. Accordingly, if red, blue, and green signals can be obtained using one pixel, or two or three pixels without reducing the cell size, the spatial luminance and the chroma resolution can be maintained while maintaining the fixed amounts of the sensitivity and the saturation level.

In order to solve the above-described problems, recently, an image sensor in which organic-photoelectric-conversion films are used has been suggested (for example, see Japanese Unexamined Patent Application Publication No. 2003-234460). According to Japanese Unexamined Patent Application Publication No. 2003-234460, an organic-photoelectric-conversion film having a sensitivity to blue, an organic-photoelectric-conversion film having a sensitivity to green, and an organic-photoelectric-conversion film having a sensitivity to red are stacked in an order to receive light. With the configuration, blue, green and red signals can be separately obtained from one pixel, thereby improving the sensitivity. However, because it is extremely difficult to stack multiple organic-photoelectric-conversion films in view of process, the implementation of multi-layered organic-photoelectric-conversion films has not been reported. The reason for this is that the harmonization between a process for lead electrodes, which are normally metal films, and a process for the organic-photoelectric-conversion films is a serious problem, and no technology for processing the lead electrodes without damage to the organic-photoelectric-conversion films has been established.

Figure 6:
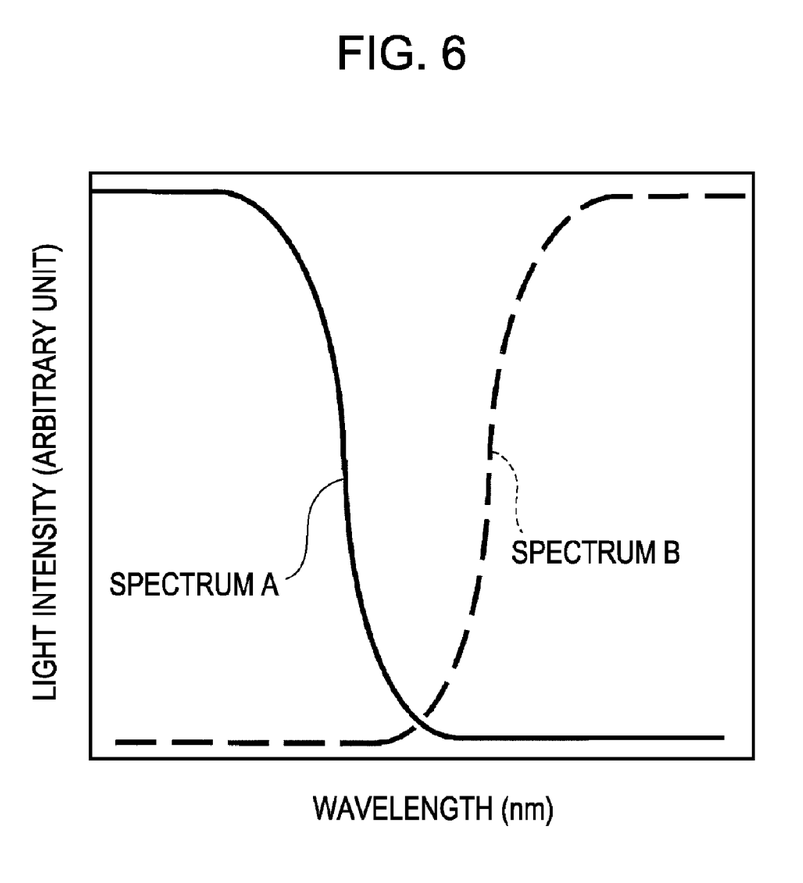
FIG. 6 is a graph showing spectral characteristics of the organic-color-filter layer.

In contrast, there are examples of a device in which light corresponding to two colors is extracted using silicon bulk spectroscopy although the number of organic-photoelectric-conversion films is one (for example, see Japanese Unexamined Patent Application Publication No. 2005-303266, and see FIG. 6 in Japanese Unexamined Patent Application Publication No. 2003-332551). However, in this device, when the difference of absorption of light with different wavelengths in a bulk of silicon is utilized, the color reproducibility is poor. For this reason, it is difficult to apply the device to a general high-resolution image sensor. Additionally, because the configuration of the device in which light corresponding to two colors is extracted through the bulk of silicon is complicated in view of process, the manufacturing cost is increased.

SUMMARY OF THE INVENTION

In a device in the related art, when the difference of absorption of light with different wavelengths in a bulk of silicon is utilized, the color reproducibility is poor. For this reason, it is difficult to apply the device to a general high-resolution image sensor.

It is desirable to improve the color reproducibility so that a device can be applied to a high-resolution image sensor.

According to an embodiment of the present invention, there is provided a solid-state imaging device including a plurality of pixels that are provided on a semiconductor substrate, and that include a plurality of photoelectric-conversion units and metal oxide semiconductor transistors that selectively read signals from the plurality of photoelectric-conversion units, an organic-photoelectric-conversion film disposed on the plurality of photoelectric-conversion units, and an organic-color-filter layer disposed on the plurality of photoelectric-conversion units. Only a signal corresponding to a first color is extracted through the organic-photoelectric-conversion film. Signals corresponding to a plurality of colors not including the first color are extracted by absorption spectroscopy using the organic-color-filter layer.

In the solid-state imaging device according to the embodiment of the present invention, since the number of organic-photoelectric-conversion films is one, the problem of the harmonization between a process for lead electrodes, which are normally metal films, and a process for the organic-photoelectric-conversion film can be avoided. Additionally, by disposing elements corresponding to the plurality of colors not including the first color, for example, as a checker pattern, in the organic-color-filter layer, the color reproducibility can be markedly improved.

According to another embodiment of the present invention, there is provided an imaging apparatus including a light-gathering-optical unit that gathers incident light, a solid-state imaging device that receives and photoelectrically converts light gathered in the light-gathering-optical unit, and a signal-processing unit that processes a photoelectrically converted signal. The solid-state imaging device includes a plurality of pixels that are provided on a semiconductor substrate, and that include a plurality of photoelectric-conversion units and metal oxide semiconductor transistors that selectively read signals from the plurality of photoelectric-conversion units, an organic-photoelectric-conversion film disposed on the plurality of photoelectric-conversion units, and an organic-color-filter layer disposed on the plurality of photoelectric-conversion units. Only a signal corresponding to a first color is extracted through the organic-photoelectric-conversion film. Signals corresponding to a plurality of colors not including the first color are extracted by absorption spectroscopy using the organic-color-filter layer.

In the imaging apparatus according to the embodiment of the present invention, the solid-state imaging device according to the embodiment of the present invention, i.e., a solid-state imaging device having an excellent color reproducibility, is used.

Therefore, an imaging apparatus with an excellent color reproducibility can be provided by including the solid-state imaging device according to the embodiment of the present invention. The solid-state imaging device has an advantage in that the problem of the harmonization between a process for the organic-photoelectric-conversion film and a process for lead electrodes, which are normally metal films, can be avoided.

In the imaging apparatus according to the embodiment of the present invention, since that solid-state imaging device having an excellent color reproducibility can be used in the imaging apparatus, the quality of taken images can be improved. Accordingly, the imaging apparatus has an advantage in that high-quality images can be recoded.

DESCRIPTION OF THE PREFERRED EMBODIMENTS

Figure 1:
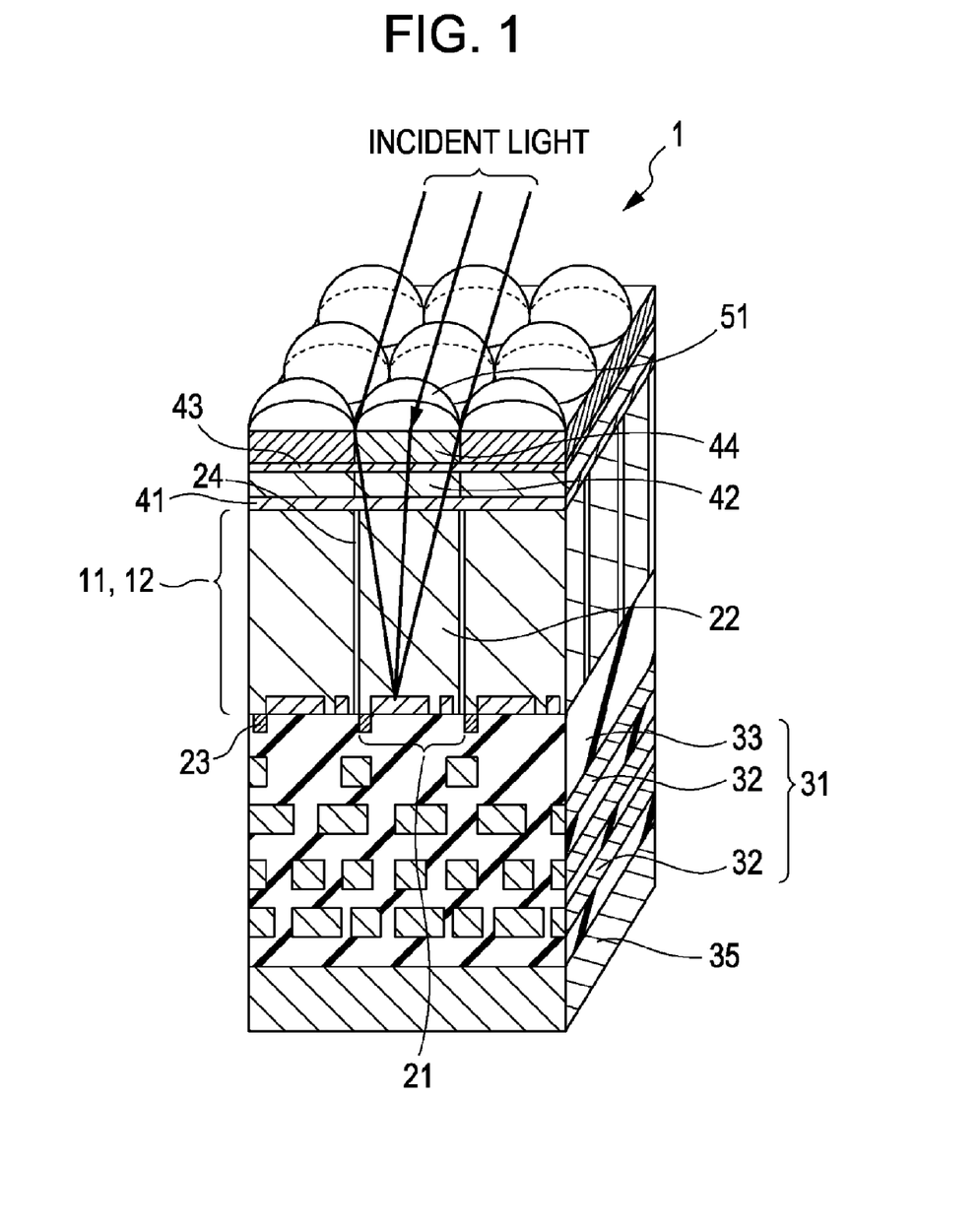
FIG. 1 is a schematic perspective view of a configuration of a solid-state imaging device according to an embodiment (a first embodiment) of the present invention.

A solid-state imaging device according to an embodiment (a first embodiment) of the present invention will be described with reference to a schematic perspective view of a configuration thereof shown in FIG. 1 and layout diagrams shown in FIGS. 2A and 2B. Referring to FIG. 1, a whole-area-open-type CMOS image sensor is shown as an application example of the solid-state imaging device according to the first embodiment of the present invention.

As shown in FIG. 1, in an active layer 12, which is formed of a semiconductor substrate 11, pixel units 21 including photoelectric-conversion units (for example, photodiodes) 22, each of which converts incident light to an electric signal, and a group of transistors 23 having transfer transistors, amplifying transistors, reset transistors, or the like (a portion of the group of transistors 23 shown in FIG. 1) are formed. As the semiconductor substrate 11, for example, a silicon substrate can be used. Additionally, a signal-processing unit (not shown in FIG. 1), which processes signal charges that are read from each of the photoelectric-conversion units 22, is formed.

At portions of the vicinities of the pixel units 21, for example, portions between the pixel units 21 disposed in the row direction or the column direction, element-isolation areas 24 are formed.

A wiring layer 31 is formed on the front surface of the semiconductor substrate 11 (the underside of the semiconductor substrate 11 in FIG. 1), in which the photoelectric-conversion units 22 are formed. The wiring layer 31 includes wiring patterns 32 and an insulating film 33 that covers the wiring patterns 32. A supporting substrate 35 is formed on the wiring layer 31. The supporting substrate 35 is, for example, a silicon substrate.

Additionally, in a solid-state imaging device 1, a planarizing film 41 with optical transparency is formed on the back surface of the semiconductor substrate 11. On the planarizing film 41 (on the top surface of the planarizing film 41 in FIG. 1), an organic-photoelectric-conversion film 42 is formed, and an organic-color-filter layer 44 is formed on an isolating layer 43 sandwiched between the organic-photoelectric-conversion film 42 and the organic-color-filter layer 44. The organic-color-filter layer 44 is formed in correspondence with the photoelectric conversion units 22. For example, in order to obtain blue and red light components, a cyan organic-color-filter layer 44C and a yellow organic-color-filter layer 44Y are disposed so as to form a checker pattern. Furthermore, on each of the cyan organic-color-filter layer 44C and the yellow organic-color-filter layer 44Y, a condenser lens 51 that gathers light into a corresponding one of the photoelectric conversion units 22 is formed.

Examples of a green colorant of the organic-photoelectric-conversion film 42 include rhodamine dye, phthalocyanines, quinacridon, eosine Y, and merocyanine dye.

In the solid-state imaging device 1, a signal corresponding to green is extracted through the organic-photoelectric-conversion film 42. Signals corresponding to blue and red are extracted through the combination of the cyan organic-color-filter layer 44C and the yellow organic-color-filter layer 44Y. Examples of two-dimensional layouts (coding) of the organic-photoelectric-conversion film 42 and the organic-color-filter layer 44 will be described with reference to FIGS. 2A and 2B.

Figure 2A:
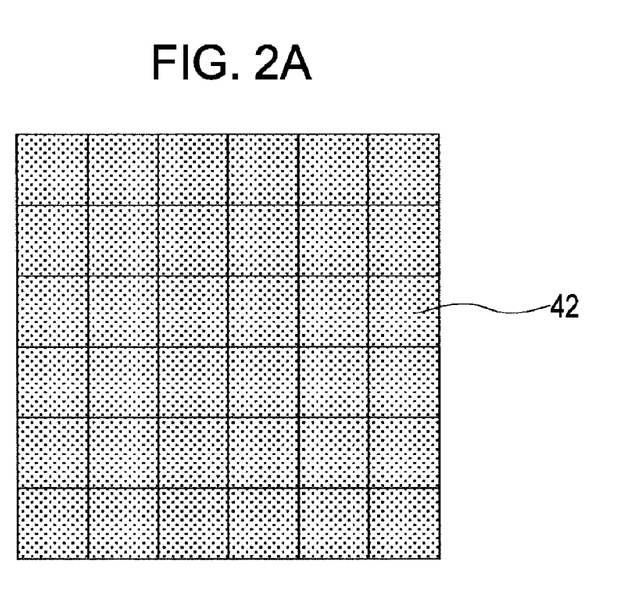
FIGS. 2A and 2B are layout diagrams showing color coding of an organic-color-filter layer.
Figure 2B:
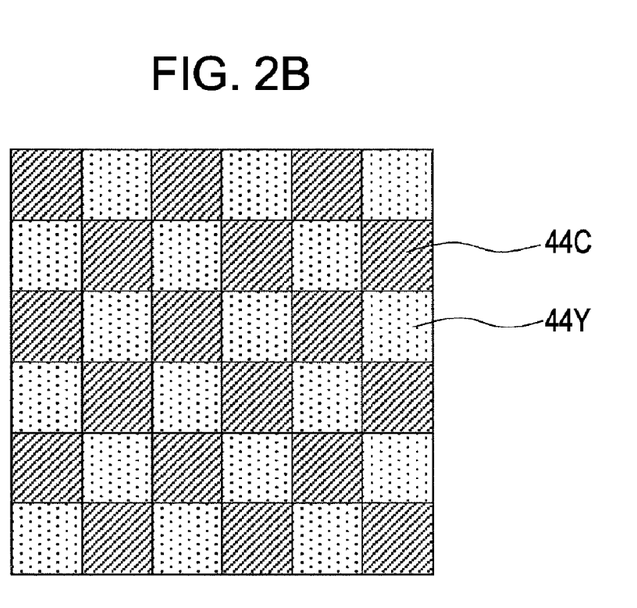
Figure 3:
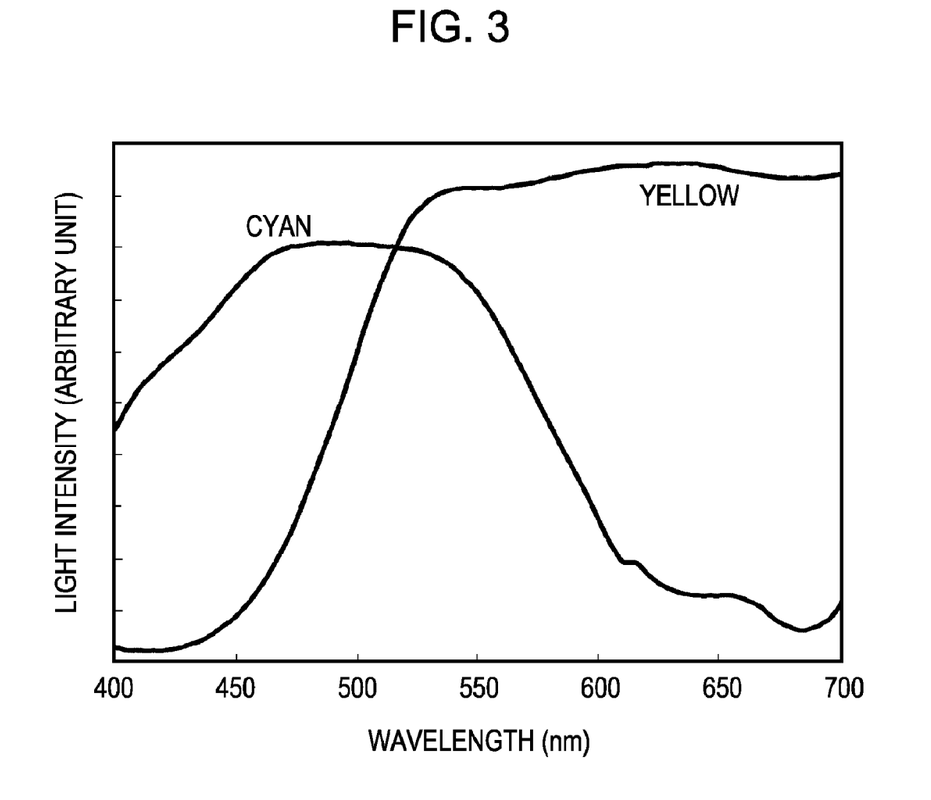
FIG. 3 is a graph showing spectral characteristics of the organic-color-filter layer.

As shown in FIG. 2A, the green colorant included in the organic-photoelectric-conversion film 42 is provided for all pixels. As shown in FIG. 2B, the cyan organic-color-filter layer 44C and the yellow organic-color-filter layer 44Y are disposed so as to form a checker pattern. The spectrums of blue and red light can be obtained using the following principle. First, as an example of spectrums in FIG. 3 shows, regarding the spectrum of blue light, the cyan organic-color-filter layer 44C absorbs a red light component to remove the red light component. Then, the green organic-photoelectricconversion film 42 absorbs a green light component to remove the green light component. As a result, a remaining blue light component can be extracted. In contrast, regarding the spectrum of red light, the yellow organic-color-filter layer 44Y absorbs a blue light component to remove the blue light component. Then, the green organic-photoelectric-conversion film 42 absorbs a green light component to remove the green light component. As a result, a remaining red light component can be extracted. Additionally, the depths of N⁻ regions and P⁺ regions (not shown in FIG. 2A or 2B), which are included in the photodiodes that are formed in the photoelectric conversion units 22, can be equally optimized for all of the pixels.

With the above-described configuration, in the solid-state imaging device 1, color signals, which are separated in correspondence with green, blue, and red, can be output. Since the organic-photoelectric-conversion film 42 is a single layer, the problem of the harmonization between a process for lead electrodes, which are normally metal films, (not shown in FIG. 1) and a process for the organic-photoelectric-conversion film 42 can be avoided. Additionally, since the organic-color-filter layer 44 can be formed using lithography technology, a dry-etching process is not necessary by employing the organic-color-filter layer 44. Accordingly, no damage occurs to the organic-photoelectric-conversion film 42. When there is a risk of the deposition of a material or the like, it is preferable that the isolating layer 43 be provided as shown in FIG. 1.

Since the cyan organic-color-filter layer 44C and the yellow organic-color-filter layer 44Y are disposed as a checker pattern, the spatial luminance and the chroma resolution become lower, but the color reproducibility can be markedly improved.

In the solid-state imaging device 1, compared with a solid-state imaging device in which color separation is performed only using a primary-color filter (for example, a color-imaging device disclosed in Japanese Unexamined Patent Application Publication No. 2003-332551), with the combination of the organic-color-filter layer 44 in complementary colors and usage of bulk spectroscopy, both the sensitivity and the color reproducibility can be improved at the same time. Additionally, the spectrums of light corresponding to complementary colors are not limited to the example shown in FIG. 3. By using the cyan organic-color-filter layer 44C and the yellow organic-color-filter layer 44Y having spectrums with higher transmittance, the reduction in the sensitivity to blue light can be suppressed.

In the solid-state imaging device 1 according to the first embodiment described above, an example is described in which the green organic-photoelectric-conversion film 42 is formed and the signals corresponding to blue and red can be extracted using the combination of the cyan organic-color-filter layer 44C and the yellow organic-color-filter layer 44Y. However, other combinations can be used. More specifically, the combination is not limited to the combination of three primary colors. A combination of neutral colors or a disposition of elements corresponding to more than three colors can be used. In addition, although an example is described in which the solid-state imaging device according to the first embodiment is applied to a whole-area-open-type CMOS image sensor, the solid-state imaging device according to the first embodiment can be obviously applied to a normal CMOS image sensor. Furthermore, the organic-color-filter layer 44 and the organic-photoelectric-conversion film 42 can be reversed in position.

Figure 4:
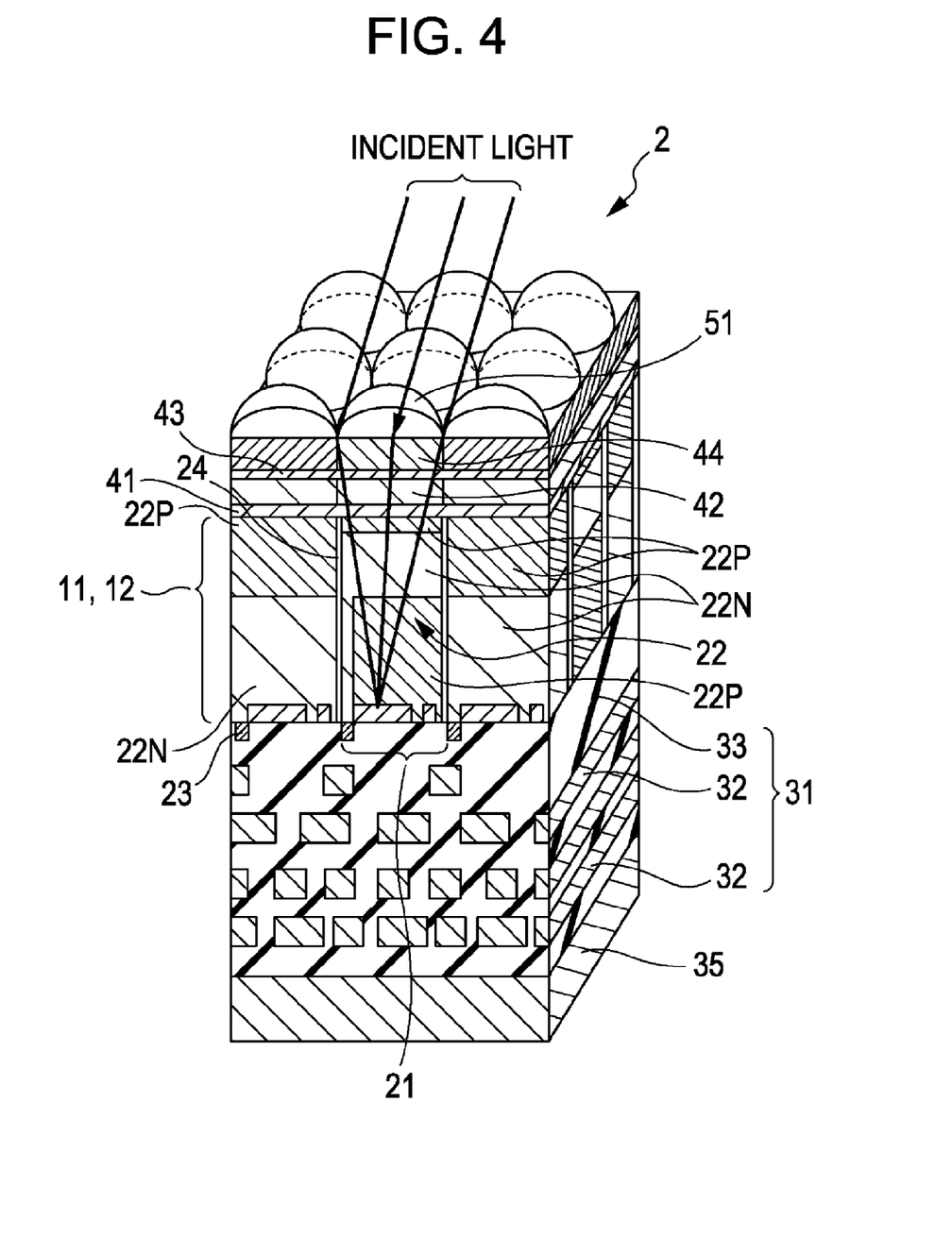
FIG. 4 is a schematic perspective view of the configuration of a solid-state imaging device according to an embodiment (a second embodiment) of the present invention.

Next, a solid-state imaging device according to an embodiment (a second embodiment) of the present invention will be described with reference to a schematic perspective view of a configuration thereof shown in FIG. 4 and the layout diagrams shown in FIGS. 2A and 2B. Referring to FIG. 4, a whole-area-open-type CMOS image sensor is shown as an application example of the solid-state imaging device according to the second embodiment of the present invention.

As shown in FIG. 4, in an active layer 12, which is formed of a semiconductor substrate 11, pixel units 21 including photoelectric-conversion units (for example, photodiodes) 22, each of which converts incident light to an electric signal, and a group of transistors 23 having transfer transistors, amplifying transistors, reset transistors, or the like (a portion of the group of transistors 23 shown in FIG. 4) are formed. As the semiconductor substrate 11, for example, a silicon substrate can be used. Additionally, a signal-processing unit (not shown in FIG. 4), which processes signal charges that are read from each of the photoelectric-conversion units 22, is formed.

At portions of the vicinities of the pixel units 21, for example, portions between the pixel units 21 disposed in the row direction or the column direction, element-isolation areas 24 are formed.

A wiring layer 31 is formed on the front surface of the semiconductor substrate 11 (the underside of the semiconductor substrate 11 in FIG. 4), in which the photoelectric-conversion units 22 are formed. The wiring layer 31 includes wiring patterns 32 and an insulating film 33 that covers the wiring patterns 32. A supporting substrate 35 is formed on the wiring layer 31. The supporting substrate 35 is, for example, a silicon substrate.

Additionally, in a solid-state imaging device 2, a planarizing film 41 with optical transparency is formed on the back surface of the semiconductor substrate 11. On the planarizing film 41 (on the top surface of the planarizing film 41 in FIG. 4), an organic-photoelectric-conversion film 42 is formed, and an organic-color-filter layer 44 is formed on an isolating layer 43 sandwiched between the organic-photoelectric-conversion film 42 and the organic-color-filter layer 44. The organic-color-filter layer 44 is formed in correspondence with the photoelectric conversion units 22. For example, in order to obtain blue and red light components, a cyan organic-color-filter layer 44C and a yellow organic-color-filter layer 44Y are disposed so as to form a checker pattern. Furthermore, on each of the cyan organic-color-filter layer 44C and the yellow organic-color-filter layer 44Y, a condenser lens 51 that gathers light into a corresponding one of the photoelectric conversion units 22 is formed.

Examples of a green colorant of the organic-photoelectric-conversion film 42 include rhodamine dye, phthalocyanines, quinacridon, eosine Y, and merocyanine dye.

In the solid-state imaging device 2, a signal corresponding to green is extracted through the organic-photoelectric-conversion film 42. Signals corresponding to blue and red are extracted through the combination of the cyan organic-color-filter layer 44C and the yellow organic-color-filter layer 44Y and bulk spectroscopy. Examples of two-dimensional layouts (coding) of the organic-photoelectric-conversion film 42 and the organic-color-filter layer 44 will be described with reference to FIGS. 2A and 2B.

As shown in FIG. 2A, the green colorant included in the organic-photoelectric-conversion film 42 is provided for all pixels. As shown in FIG. 2B, the cyan organic-color-filter layer 44C and the yellow organic-color-filter layer 44Y are disposed so as to form a checker pattern. The spectrums of blue and red light can be obtained using the following principle. First, as an example of spectrums in FIG. 3 shows, regarding the spectrum of blue light, the cyan organic-color-filter layer 44C absorbs a red light component to remove the red light component. Then, the green organic-photoelectric-conversion film 42 absorbs a green light component to remove the green light component. As a result, a remaining blue light component can be extracted. In contrast, regarding the spectrum of red light, the yellow organic-color-filter layer 44Y absorbs a blue light component to remove the blue light component. Then, the green organic-photoelectric-conversion film 42 absorbs a green light component to remove the green light component. As a result, a remaining red light component can be extracted.

In order to obtain bulk spectrums of blue and red light, the depths of N⁻ regions 22N and P⁺ regions 22P, which are included in the photodiodes that are formed in the photoelectric conversion units 22, are not equalized. In other words, regarding the bulk spectrum of blue light, N⁻ regions 22N are formed in a region close to a light incident side (a region where the depth of light propagation is small), and photoelectric conversion of blue light is preferentially performed in the N⁻ regions 22N. In a region where the depth of light propagation is large, P+ regions 22P are formed to suppress photoelectric conversion of red light. In contrast, regarding the bulk spectrum of red light, N⁻ regions 22N are formed in a region far from the light incident side (a region where the depth of light propagation is large), and photoelectric conversion of red light is preferentially performed in the N⁻ regions 22N. In a region where the depth of light propagation is small, P+ regions 22P with a large depth are formed to suppress photoelectric conversion of blue light. It is also necessary to optimize the depths of the N⁻ regions 22N and the P+ regions 22P in the pixels in accordance with the wavelengths of light. Regarding the combination of the organic-color-filter layer 44 and a color of pixels, pixels for blue are provided below the cyan organic-color-filter layer 44C, and pixels for red are provided below the yellow organic-color-filter layer 44Y.

With the above-described configuration, in the solid-state imaging device 2, color signals, which are separated in correspondence with green, blue, and red, can be output. Since the organic-photoelectric-conversion film 42 is a single layer, the problem of the harmonization between a process for lead electrodes, which are normally metal films, (not shown in FIG. 4) and a process for the organic-photoelectric-conversion film 42 can be avoided. Additionally, since the organic-color-filter layer 44 can be formed using lithography technology, a dry-etching process is not necessary by employing the organic-color-filter layer 44. Accordingly, no damage occurs to the organic-photoelectric-conversion film 42. When there is a risk of the deposition of a material or the like, it is preferable that the isolating layer 43 be provided as shown in FIG. 4.

Since the cyan organic-color-filter layer 44C and the yellow organic-color-filter layer 44Y are disposed as a checker pattern, the spatial luminance and the chroma resolution become lower, but the color reproducibility can be markedly improved.

In the solid-state imaging device 2, compared with a solid-state imaging device in which color separation is performed only using a primary-color filter (for example, a color-imaging device disclosed in Japanese Unexamined Patent Application Publication No. 2003-332551), with the combination of the organic-color-filter layer 44 in complementary colors and using of bulk spectroscopy, both the sensitivity and the color reproducibility can be improved at the same time. Additionally, the spectrums of light corresponding to complementary colors are not limited to the example shown in FIG. 3. By using the cyan organic-color-filter layer 44C and the yellow organic-color-filter layer 44Y having spectrums with higher transmittance, the reduction in the sensitivity to blue light can be suppressed.

In the solid-state imaging device 2 according to the second embodiment described above, an example is described in which the green organic-photoelectric-conversion film 42 is formed and the signals corresponding to blue and red can be extracted using the combination of the cyan organic-color-filter layer 44C and the yellow organic-color-filter layer 44Y. However, other combinations can be used. More specifically, the combination is not limited to the combination of three primary colors. A combination of neutral colors or a disposition of elements corresponding to more than three colors can be used. In addition, although an example is described in which the solid-state imaging device according to the second embodiment is applied to a whole-area-open-type CMOS image sensor, the solid-state imaging device according to the second embodiment can be obviously applied to a normal CMOS image sensor. Furthermore, the organic-color-filter layer 44 and the organic-photoelectric-conversion film 42 can be reversed in position.

Figure 5A:
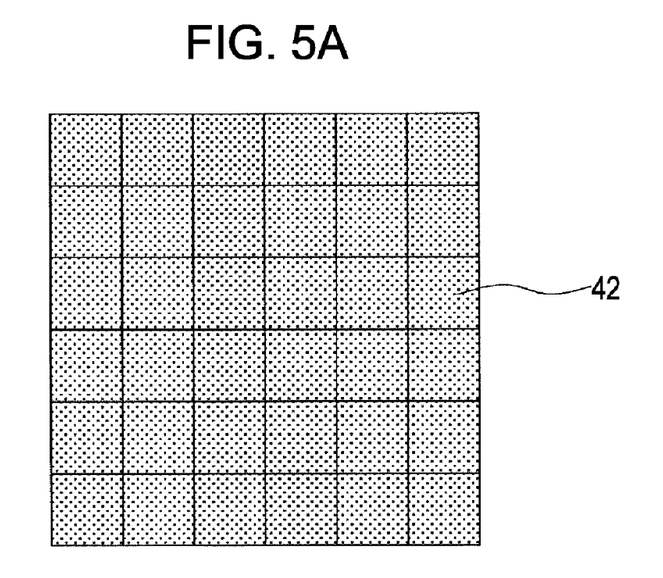
FIGS. 5A and 5B are layout diagrams showing color coding of an organic-color-filter layer.
Figure 5B:
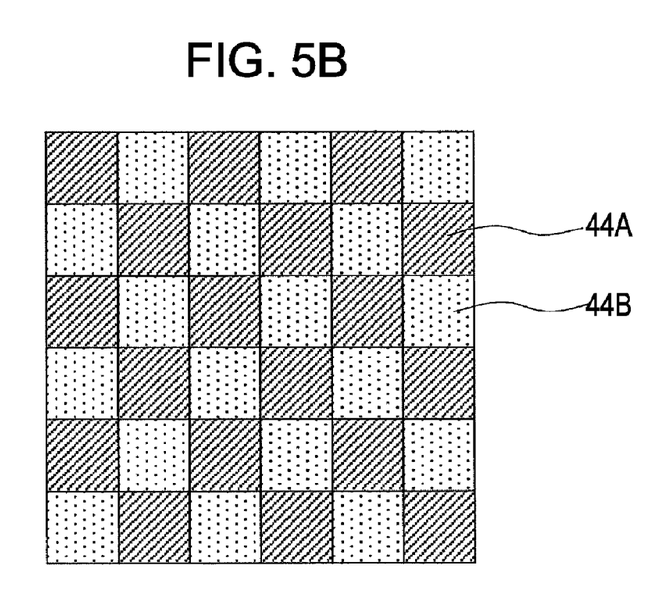

In the solid-state imaging device 2 according to the second embodiment described above, an example of the spectrums of the cyan organic-color-filter layer 44C and the yellow organic-color-filter layer 44Y is described. As shown in FIG. 5B, in another example of the spectrums of the organic-color-filter layer 44, an organic-color-filter layer 44A, which has a characteristic of absorption wavelength indicated by a spectrum A, and an organic-color-filter layer 44B, which has a characteristic of absorption wavelength indicated by a spectrum B, are disposed as a checker pattern. As shown in FIG. 5A, a green organic-photoelectric-conversion film is used as the organic-photoelectric-conversion film 42.

Ideally, as shown in FIG. 6, it is preferable that the organic-color-filter layer 44A and the organic-color-filter layer 44B have spectral characteristics indicated by the spectrum A and the spectrum B, respectively. Additionally, for bulk spectrums in this case, it is more preferable that a combination of an element having a sensitivity to blue light, which is provided below the organic-color-filter layer 44A having the spectral characteristic indicated by the spectrum A, and an element having a sensitivity to red light, which is provided below the organic-color-filter layer 44B having the spectral characteristic indicated by the spectrum B, be used.

As the combination of the organic-photoelectric-conversion film 42 and the organic-color-filter layer 44, besides the combinations described in the first and second embodiments, there are the following combinations: (1) A blue organic-photoelectric-conversion film is used as the organic-photoelectric-conversion film 42, and a combination of a green organic-color-filter layer and an organic-color-filter layer having a spectral characteristic indicated by the spectrum B is used for the organic-color-filter layer 44; and (2) A red organic-photoelectric-conversion film is used as the organic-photoelectric-conversion film 42, and a combination of a green organic-color-filter layer and an organic-color-filter layer having a spectral characteristic indicated by the spectrum A is used for the organic-color-filter layer 44. In view of the improvement of color separation, it is preferable that the first and second embodiments described above be used.

As described above, with the solid-state imaging devices 1 and 2 according to the first and second embodiments of the present invention, the color reproducibility can be improved. Thus, the solid-state imaging devices 1 and 2 can be applied to high-resolution image sensors.

Next, an imaging apparatus according to an embodiment of the present invention will be described with reference to a block diagram shown in FIG. 7. Examples of this imaging apparatus include a video camera, a digital still camera, and a camera for a mobile phone.

Figure 7:
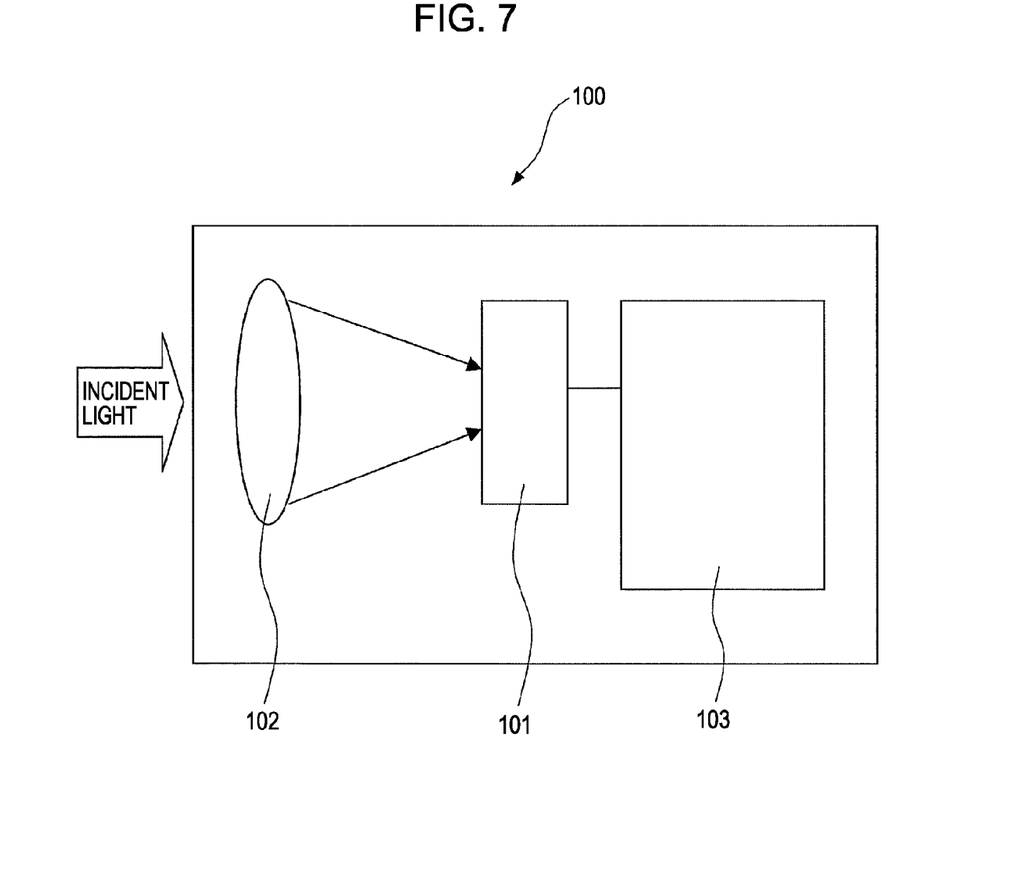
FIG. 7 is a block diagram of an imaging apparatus according to an embodiment of the present invention.

As shown in FIG. 7, an imaging apparatus 100 includes an imaging unit 101 having a solid-state imaging device (not shown in FIG. 7). On the light-gathering side of the imaging unit 101, an imaging-optical system 102 that forms images is provided. The imaging unit 101 is connected to a driving circuit, which drives the imaging unit 101, and to a signal-processing unit 103 including a signal-processing circuit that processes signals, which are photoelectrically converted in the solid-state imaging device, to obtain images. Image signals obtained in the signal-processing unit 103 can be stored in an image-storing unit (not shown in FIG. 7). In the imaging apparatus 100, as the above-described solid-state imaging device, the solid-state imaging device 1 or 2, which is described in the foregoing embodiment, can be used.

In the imaging apparatus 100 according to the embodiment of the present invention, since the solid-state imaging device 1 or 2 according to the first or second embodiment of the present invention can be used, as in the above-described case, the amount of pixel information in vertical direction of the solid-state imaging device or in vertical and horizontal directions of the solid-state imaging device can be made decreased. As a result, the imaging apparatus 100 has an advantage in that a high frame rate can be achieved.

The configuration of the imaging apparatus 100 according to the embodiment of the present invention is not limited to the above-described configuration. Any configuration of an imaging apparatus in which the solid-state imaging device is used can be employed as the configuration of the imaging apparatus 100.

Each of the solid-state imaging devices 1 and 2 described above may be configured as a single chip or as module including an imaging function, in which the imaging unit and the signal-processing unit or the optical system are integrated. Embodiments of the present invention can provide a solid-state imaging device and an imaging apparatus. In this case, the imaging apparatus has an advantage in that a high image quality can be achieved. Here, the imaging apparatus refers to, for example, a portable apparatus having a camera or an imaging function. The term "imaging" refers to not only taking images in a normal case of photographing with a camera but also detecting fingerprints or the like in a broad sense.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels provided on a semiconductor substrate, the plurality of pixels including a plurality of photoelectric-conversion units and metal oxide semiconductor transistors that selectively read signals from the plurality of photoelectric-conversion units;
an organic-photoelectric-conversion film disposed on the plurality of photoelectric-conversion units, the organic-photoelectric-conversion film configured to absorb a first color; and
an organic-color-filter layer disposed on the plurality of photoelectric-conversion units,
wherein,
only a signal corresponding to the first color is extracted through the organic-photoelectric-conversion film, and
signals corresponding to a plurality of colors not including the first color are extracted by a combination of absorption spectroscopy using the organic-color-filter layer and bulk spectroscopy,
the organic color filter layer includes a checker pattern of second and third color elements, the checker pattern does not include the first color,
the absorption spectroscopy uses absorption spectrums of separate pixels corresponding to the second and third color elements, and
the bulk spectroscopy uses silicon bulk corresponding to the plurality of colors not including the first color.

2. The solid-state imaging device according to claim 1, wherein the first color is green such that a signal corresponding to green is extracted through the organic-photoelectric-conversion film, and the plurality of colors not including the first color correspond to blue and red such that signals corresponding to blue and red are extracted by absorption spectroscopy of separate pixels corresponding to the second and third color elements, the second and third color elements correspond to cyan and yellow elements formed as a checker pattern in the organic-color-filter layer.

3. A solid-state imaging device comprising:
a plurality of pixels provided on a semiconductor substrate, the plurality of pixels including a plurality of photoelectric-conversion units and metal oxide semiconductor transistors that selectively read signals from the plurality of photoelectric-conversion units;
an organic-photoelectric-conversion film disposed on the plurality of photoelectric-conversion units; and
an organic-color-filter layer disposed on the plurality of photoelectric-conversion units,
wherein,
only a signal corresponding to green is extracted through the organic-photoelectric-conversion film,
signals corresponding to a plurality of colors, including blue and red and not including green, are extracted by a combination of absorption spectroscopy using the organic-color filter layer and bulk spectroscopy,
the organic color filter layer includes a checker pattern of cyan and yellow elements, the checker pattern does not include a green element,
the absorption spectroscopy uses absorption spectrums of separate pixels corresponding to cyan and yellow elements, and
the bulk spectroscopy uses silicon bulk corresponding to blue and red lights.

4. An imaging apparatus comprising:
a light-gathering optical unit that gathers incident light;
a solid-state imaging device that receives and photoelectrically converts the light gathered in the light-gathering optical unit; and
a signal-processing unit that processes a photoelectrically converted signal, the solid-state imaging device including
a plurality of pixels provided on a semiconductor substrate, the plurality of pixels including a plurality of photoelectric-conversion units and metal oxide semiconductor transistors that selectively read signals from the plurality of photoelectric-conversion units,
an organic-photoelectric-conversion film disposed on the plurality of photoelectric-conversion units, the organic-photoelectric-conversion film configured to absorb a first color, and
an organic-color-filter layer disposed on the organic-photoelectric-conversion film,
wherein, only a signal corresponding to the first color is extracted through the organic-photoelectric-conversion film, signals corresponding to a plurality of colors not including the first color are extracted by a combination of absorption spectroscopy using the organic-color-filter layer and bulk spectroscopy, the organic color filter layer includes a checker pattern of second and third color elements, the checker pattern does not include the first color, the absorption spectroscopy uses absorption spectrums of separate pixels corresponding to the second and third color elements, and the bulk spectroscopy uses silicon bulk corresponding to the plurality of colors not including the first color.

* * * * *